United States Patent
Church et al.

(10) Patent No.: US 7,972,650 B1
(45) Date of Patent: Jul. 5, 2011

(54) METHOD FOR MANUFACTURING 3D CIRCUITS FROM BARE DIE OR PACKAGED IC CHIPS BY MICRODISPENSED INTERCONNECTIONS

(75) Inventors: Kenneth H. Church, Orlando, FL (US); Patrick Clark, Orlando, FL (US); Dongjiang Xu, Casselberry, FL (US); Lance Swan, Orlando, FL (US); Bryan Irwin, Winter Springs, FL (US); Vladimir Pelekhaty, Maitland, FL (US)

(73) Assignee: nScrypt, Inc., Orlando, FL (US)

( * ) Notice: Subject to any disclaimer, the term of this patent is extended or adjusted under 35 U.S.C. 154(b) by 1381 days.

(21) Appl. No.: 11/457,400

(22) Filed: Jul. 13, 2006

Related U.S. Application Data

(60) Provisional application No. 60/595,542, filed on Jul. 13, 2005.

(51) Int. Cl.
B05D 5/12 (2006.01)
B05D 3/00 (2006.01)

(52) U.S. Cl. ........... 427/96.1; 427/97.7; 427/98.4; 427/117

(58) Field of Classification Search .......... 427/96.1, 427/98.4, 97.7, 117
See application file for complete search history.

(56) References Cited

U.S. PATENT DOCUMENTS

| | | | | |
|---|---|---|---|---|
| 5,141,602 A | * | 8/1992 | Chen et al. | 205/103 |
| 5,631,191 A | * | 5/1997 | Durand et al. | 438/119 |
| 5,675,180 A | | 10/1997 | Pedersen et al. | |
| 6,588,097 B2 | * | 7/2003 | Nishide et al. | 29/832 |
| 2005/0266154 A1 | * | 12/2005 | Devos et al. | 427/96.1 |

OTHER PUBLICATIONS

Val, Christian and Lemoine, Thierry, "3-D Interconnection for Ultra-Dense Multichip Modules," IEEE Transactions on Components, Hybrids, and Manufacturing Technology, Dec. 1990, vol. 13, No. 4, Institute of Electrical and Electronics Engineers, Inc. (Las Vegas, Nevada, US).

* cited by examiner

*Primary Examiner* — Brian K Talbot
(74) *Attorney, Agent, or Firm* — McKee, Voorhees & Sease, P.L.C.

(57) ABSTRACT

A method for manufacturing an electronic circuit in three-dimensional space provides for interconnecting electronic components within the circuit by directly writing conducting lines. The method may include observing a direct writing tool of a direct write system using a vision system, determining proper placement of the direct writing tool at least partially based on the step of observing, and directly writing conducting lines in three dimensions using the proper placement. The direct writing may be on a surface or in free space. The method may include stacking a plurality of chips to provide a stack having a top surface and edges extending away from the top and interconnecting connections of the chips by directly writing conducting lines along one of the edges.

30 Claims, 7 Drawing Sheets

METHOD FOR MANUFACTURING 3D CIRCUITS FROM BARE DIE OR PACKAGED IC CHIPS BY MICRODISPENSED INTERCONNECTIONS

CROSS-REFERENCE TO RELATED APPLICATIONS

This application claims the benefit of provisional patent application Ser. No. 60/595,542 filed Jul. 13, 2005, entitled THREE DIMENSIONAL ELECTRICAL CIRCUITS, the contents of which are hereby incorporated by reference in their entirety.

FIELD OF THE INVENTION

The present invention relates to the field of three dimensional electronic circuits manufactured from bare die or pre-packaged IC chips by direct written interconnections.

BACKGROUND OF THE INVENTION

The current 3D packaging and interconnection technology is generally limited to the tasks of producing the dense arrays of stacked memory or processing IC chips for the sake of increasing the capacity and processing power within the limited footprint on the printed circuit board. The current technological processes utilize the soldering connections of the pre-aligned arrays of the designated contact pads by dipping the edge of the stack into a vat of molten solder or by re-flowing the toughing solder bumps on the adjacent chips. What is needed is a method for the fabrication of 3D circuits which overcomes problems in the art.

DETAILED DESCRIPTION OF THE PREFERRED EMBODIMENTS

Figure 1:
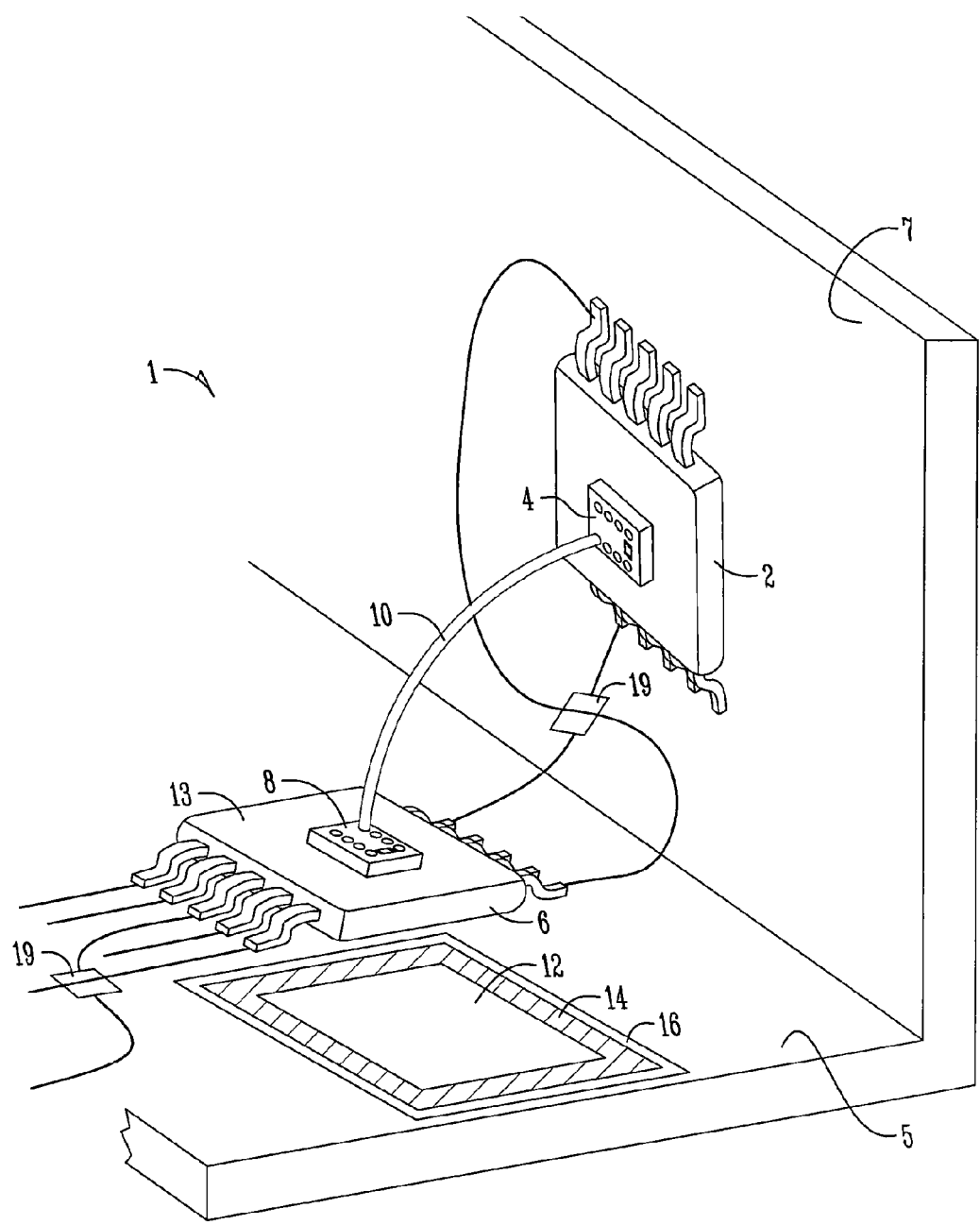
FIG. 1 is a photographic illustration of one embodiment of a 3D electronic circuit containing electronic components which are interconnected by microdispensed conducting lines.

The present invention to improve upon the state of the art. The present invention provides for 3D packaging and interconnection. The present invention also provides for 3D packaging and interconnection in a manner beyond stacking of integrated circuit chips.

In addition, the present invention provides for 3D electronic circuits having small footprints and high volumetric density of components, and provides for improved cooling of heat generating components by enhanced heat exchange.

Further, the present invention provides for flexibility in a 3D electronic circuit such that the circuit may built where space is highly limited, on the conformal surfaces of solid or flexible substrates, or even without any substrate at all, directly on the sidewalls of the device enclosure or anywhere else on the skin or the structure of the hosting apparatus.

One or more of these and/or other objects, features, or advantages of the present invention will become apparent from the specification and claims that follow.

The present invention provides a method of constructing the true three-dimensional electronic circuits by interconnecting its constituent components via conductor lines written by microdispensing of electrically conducting adhesive or re-flowable solder paste. By these means true 3D electronic circuits can be built both in space and on the conformal surfaces. The 3D circuit can be built both from individual ICs (pre-packaged or bare die chips) and vertically stacked arrays thereof. In the former case, the 3D circuit is built by connecting the leads of pre-packaged ICs or contact pads of bare die chips with other components by written conducting lines. The pins of multiple ICs or contact pads of chips incorporated in the vertically stacked array are mutually interconnectable by the conductive lines, written on the stacked up edges of the vertically stacked array. The additional means to interconnect the chips within the stack in the areas besides the edges of the stacked chips is to inject the conducting paste in the vias laser drilled or reactively etched through the surface of the chips.

The variety of the characteristics of the dispensable materials allows for writing of the various functional parts of the 3D electronic circuit. The highly conductive paste is used for low resistance interconnections both within the stacked ICs and between them and other constituents of the 3D electronic circuit, like passive components of the type of discrete resistors and capacitors, and power sources, as well as input/output peripherals and indicators. Direct writing of the inductor coils, high frequency inductor lines and antennae is also done by microdispensing of highly conductive paste. Low electrically conductive polymer or powder based paste is used for direct writing of biasing and other necessary resistors. Filtering and timing capacitors can be directly written with the thin layer of high dielectric constant ceramic (for example, barium titanate) powder paste sandwiched between two conductive layers. The ability to dispense electrically isolating polymer based adhesives and coatings allows for securing components of the 3D electronic circuit and providing the electrically isolating bridges between intersecting conducting lines. High heat conductive ceramic or oxide based adhesive paste enhances the dissipation the heat generated in ICs and other components directly bondable to heat sinks or chassis.

Direct writing of the electrically conducting connection lines and some of the aforementioned passive components makes it possible to place them on any non-specific (dielectric or conductive, in the last case—with underlain dielectric isolation layer) substrate, including flexible, and more over, without any substrate at all. The components of the 3D circuit may be connected and attached to any conformal surface of solid or flexible carrier (for example, the inner surface of the device enclosure) or even to each other, forming truly 3D circuit in space.

The tasks of precisely writing the multiple electrical connections between the densely placed pins of ICs and contact pads of the chips and discrete components, as well as writing some of the components themselves, can be accomplished under computer control through use of a vision system, capable of the image analysis and recognition based aiming, referencing and calibration of the microdispensing tools.

The 3D electronic circuit produced in accordance with current invention bare multiple advantageous properties: small footprint and high volumetric density of the components; improved cooling of the heat generating components by enhanced heat exchange; extreme flexibility of their realization, allowing for building them in scarce spaces, on the conformal surfaces of the solid or flexible substrate or even without any substrate at all, directly on the sidewalls of the device enclosure or anywhere else on the skin or the structure of the hosting apparatus.

According to one aspect of the present invention, a method for manufacturing an electronic circuit in three-dimensional space is provided. The method includes interconnecting electronic components by directly writing conducting lines in three dimensions. The step of directly writing conducting lines in three dimensions may include directly writing conducting lines along a substrate surface and one or more additional surfaces which are non-planar relative to the substrate surface. In addition, the step of directly writing may be performed in free space. The conducting lines may be of various materials including curable conductive polymer resins, reflowable solder paste, particle based materials in a carrier, or other substances. Where dielectric isolation is desired, dielectric isolation bands, or dielectric patches may be directly written. The electronic circuit may include vertically stacked bare die chips, or vertically stacked packaged integrated circuits. Interconnections between pins, pads, or other connectors may be formed through direct writing conducting lines along edges of the vertical stacks or through vias formed in chips.

According to another aspect of the present invention, a method for manufacturing an electronic circuit comprised of electronic components in three-dimensional space is provided. The method includes observing a direct writing tool of a direct write system using a vision system, determining proper placement of the direct writing tool at least partially based on the step of observing, and directly writing conducting lines in three dimensions using the proper placement. The conducting lines may be written on any number of size and shapes of surfaces, thus the surface need not be planar. The conducting lines may even be directly written on an edge of an integrated circuit or in free space between multiple surfaces.

According to another aspect of the present invention, a system for fabricating a three-dimensional electronic circuit is provided. The system includes a direct write system adapted for directly writing microdispensed conducting lines for the three-dimensional electronic circuit, a vision system, and a computer control system in operative communication with the direct write microdispensing system and the vision system. The computer control system is adapted for calibrating the direct write system based on the vision system to thereby precisely place the conducting lines of the three dimensional electronic circuit.

According to another aspect of the present invention, a method for manufacturing an electronic circuit in three-dimensional space is provided. The method includes stacking a plurality of chips to provide a stack having a top surface and edges extending downwardly from the top surface to a substrate and interconnecting connections of the chips by directly writing conducting lines along one of the edges. The chips may be bare dies or prepackaged integrated circuits. The conducting lines may form bus lines between the plurality of chips. The substrate may be of any number of types, including being of a conformal shape.

The present invention provides a method of constructing the true three-dimensional electronic circuits by interconnecting its constituent components via conductive lines. The conductive lines may be written by microdispensing of electrically conducting adhesive or re-flowable solder paste. Alternatively, the conducting lines may be polymer based or any particle based material that is in a carrier. This includes thick film materials which may be of medium to high viscosity and this includes low viscosity materials as well.

The present invention uses direct writing in a number of different ways to provide significant advantages. Because direct writing is used, the 3D electronic circuit may use any number of types of substrates, including substrates of conformal shape or where there is no separate substrate, instead the 3D electronic circuit being formed directly on a host structure having some other primary purpose (such as a side wall of an enclosure). The direct writing techniques allow for conducting lines, passive components, insulating layers, and other circuit features to be placed in any number of places, including along the sides or edges of component parts and in free space. Thus, for example, vertical stacks of components can be formed where interconnecting lines, including, but not limited to bus lines being written along the sides of the component parts. Placement of the electronic components in three dimensions may be facilitated through using a vision system.

FIG. 1 provides an illustration of one embodiment of the present invention. It is to be understood that 3D electronic circuit shown in FIG. 1 is merely representative to show examples of different aspects and topologies of the invention, therefore not all conduction lines or components are shown in the interest of clarity. As shown in FIG. 1 a 3D electronic circuit 1 is shown having a number of electronic components, including integrated circuit 2 with a bare die 4 forming a vertical stack, and integrated circuit 13 and bare die 8 forming a vertical stack. There is a free space connection 10 between one connector of the bare die 4 and the bare die 8. The free space connection 10 is directly written. Portions of the 3D electronic circuit 1 are on a first surface 7 which may, for example, be the inside surface of an enclosure. Other portions of the 3D electronic circuit 1 are on a second surface 5, which also may be on the inside surface of an enclosure. Note that the first surface 5 and the second surface 7 are nonplanar relative to each other. Also note that the directly written connection 10 is in free space to connect between components on the first surface and components on the second surface. Also shown FIG. 1 are insulating patches 19 which are provided at intersections of conducting lines to avoid electrical contact between the conducting lines. Also shown in FIG. 1 is a ground plate 16 upon which a dielectric 14 is directly written. A top electrode 12 is directly written on the dielectric layer 14. In addition, the 3D electronic circuit of FIG. 1 may be written onto a conformal substrate. The present invention allows for the electronic circuit to be written on any number of types of substrates, including solid, flexible or any conformal surface and in free space. The electronic circuit may, for example, be directly written on the sidewalls of the device enclosure or anywhere else on the skin or the structure of the hosting apparatus, or on the components themselves.

Additional disclosure regarding the direct writing of electronic components, including antennas onto substrates is provided in U.S. patent application Ser. No. 11/422,176, filed Jun. 5, 2006, and entitled OPTIMIZATION OF UNIQUE ANTENNA AND RF SYSTEMS FOR SPECIFIC SUBSTRATES, which is herein incorporated by reference in its entirety.

The present invention uses direct write or direct printing technology. The present invention contemplates the use of any number of direct-write technologies. This includes the direct printing of mesoscale materials, such as metals and ceramics for conductors, dielectrics, ferroelectrics, and ferromagnetics. Technologies that can be used include, without limitation, Maskless Mesoscale Materials Deposition (available from M3D), Ink Jet (available from MicroFab), nScrypt, and micron scale laser sintering and ablation. Preferably, the direct write microdispensing system is obtained from nScrypt, Inc. Using direct write or direct print technologies, circuit features may be printed on a variety of materials, and on a variety of surfaces suitable for use in many different types of environments or applications. Surfaces can be large and flat, small and bumpy.

Writing of the conductive lines can be accomplished in the free space by dispensing the conductive paste in the air instead of on any substrate. The paste being dispensed may be capable of being pre-cured, for example, by UV light to harden the just dispensed material for it to be able to maintain the desired shape of a column, arc or straight line reaching from one contact pad to another through the free space without any supporting substrate. This allows for bridging short gaps between components, chips, ICs and part of the whole 3D circuit straightly and easily, without the need of longer and complicated routing of the conducting lines on the surface of the supporting substrate.

Figure 2C:
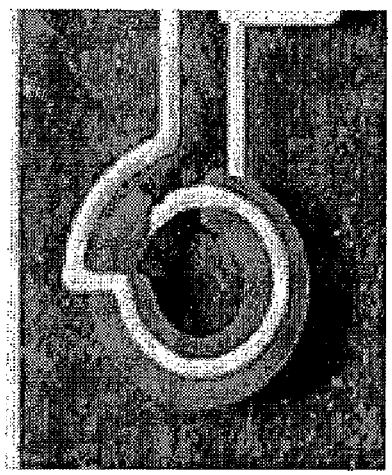
FIG. 2C is a photograph illustrating direct writing of an LC network.
Figure 2B:
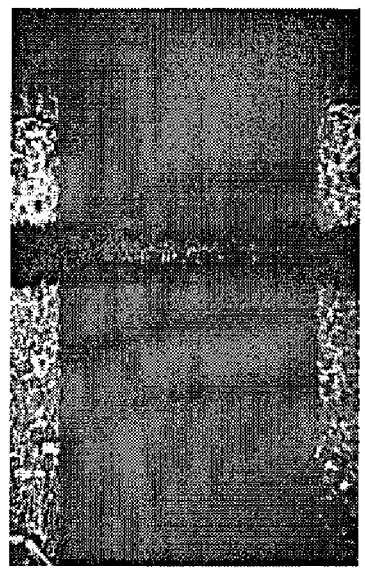
FIG. 2B is a photograph illustrating direct writing of resistors, the resistor shown being approximately 300 micrometers wide.
Figure 2A:
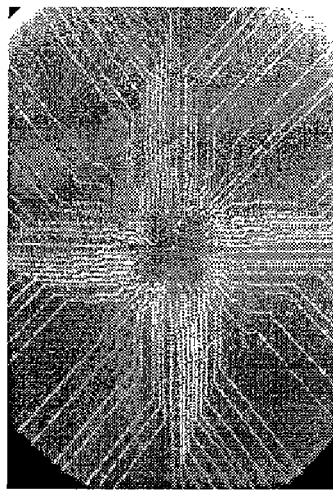
FIG. 2A is a photograph illustrating direct writing of interconnects with 50 micrometer lines and 50 micrometer spacing between the lines.

The present invention provides for direct writing of various electronic components within the 3D circuit. FIG. 2A is a photograph illustrating direct writing of interconnects with 50 micrometer lines and 50 micrometer spacing between the lines. FIG. 2B is a photograph illustrating direct writing of resistors, the resistor shown being approximately 300 micrometers wide. FIG. 2C is a photograph illustrating direct writing of an LC network. Other types of electronic components can be written, including antennas, or other types of passive components. Of course, electronic components may be incorporated into the 3D electronic circuit as discrete elements instead of being directly written. Where direct writing is used, direct writing is performed through microdispensing of the proper substances. For example, low ohmic resistance silver powder paste may be used for conductors, high resistance conductive polymer or carbon powder based pastes may be used for resistors, and high dielectric constant ceramic powder (for example, barium titanate) based paste may be used for the dielectric of a capacitor. Of course, the present invention contemplates that any number of substances may be used as may be appropriate for a particular circuit.

Figure 3:
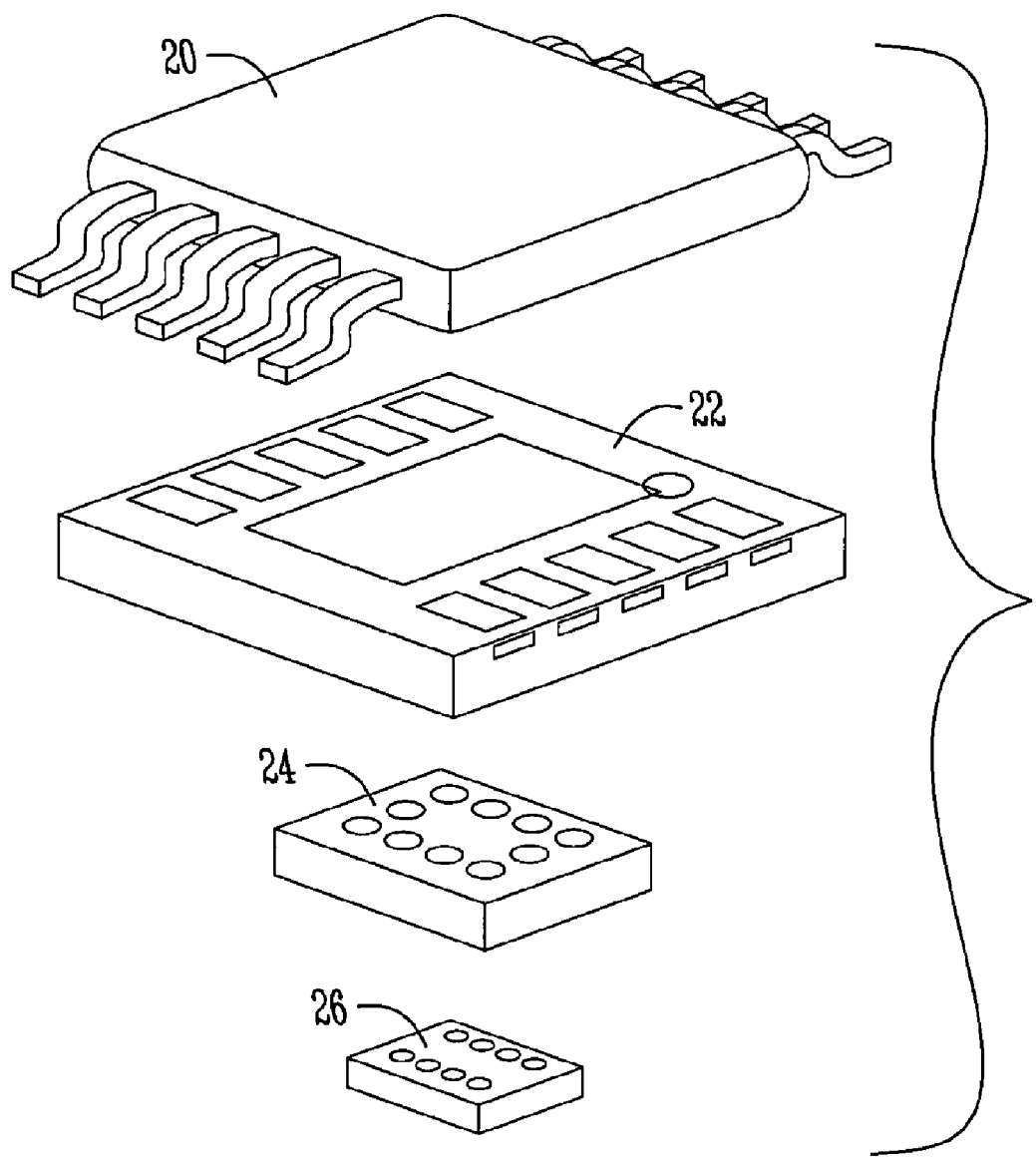
FIG. 3 illustrates different package sizes for integrated circuits which can be a part of three-dimensional circuits according to the present invention.

In addition, to passive components, the present invention provides for use of integrated circuits of various types. FIG. 3 illustrates representative examples of various types of IC packages used within the 3D electronic circuit of the present invention. The 3D electronic circuit may include an integrated circuit having a mini SOIC package 20, an LLP package 22, a micro SMD package 24, or a bare die 26. Although any type of package can be used according to the present invention, generally a smaller package or a bare die is preferred in order to reduce use of space.

Where the 3D electronic circuit includes heat generating active components, the heat generating active components of the 3D electronic circuit can be bonded directly by the heat conducting ceramic or oxide based adhesive paste to the designated heat sinks or highly thermocapacitive parts of enclosure or chassis to enhance the cooling by heat conduction.

Figure 4:
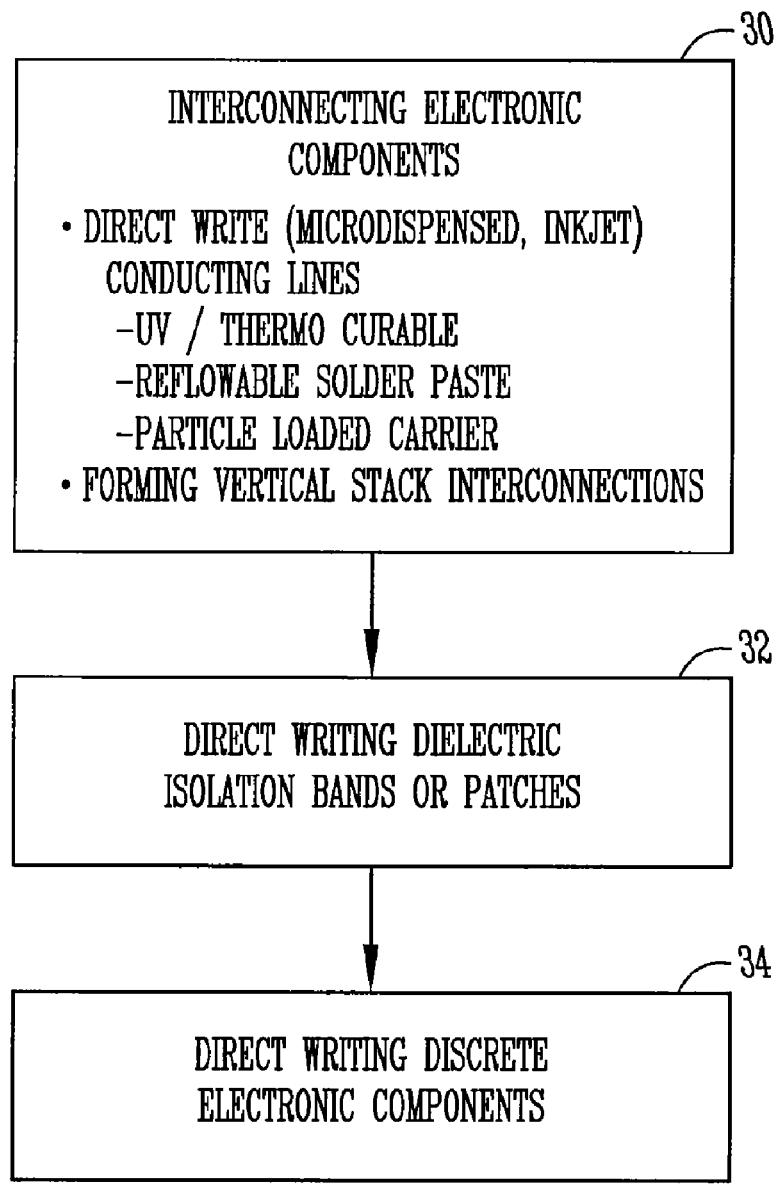
FIG. 4 illustrates the methodology of the present invention according to one embodiment of the present invention.

FIG. 4 illustrates the methodology of the present invention according to one embodiment of the present invention. Step 30 provides for interconnecting electronic components. The electronic components are interconnected using directly written microdispensed conducting lines. The conducting lines may be of conductive polymer resin, including a UV light or thermo-curable conductive polymer resin. Alternatively, the conducting lines may be formed of a reflowable solder paste, or of a particle based material in a carrier.

The present invention also contemplates that these interconnections may involve stacked electronic components and therefore the step of interconnecting electronic components may include forming vertical stack interconnections. These vertical stacks may be formed of chips of the same or different packaging.

Next in step 32, the present invention provides for direct writing dielectric isolation bands or patches. Dielectric bands are written where the substrate or a portion of the substrate is a conductor, such as when the substrate is a metal. After a dielectric band is written, electronic components may be directly written on the dielectric band or microdispensed conducting lines may be written directly on the dielectric band.

The dielectric isolation band may, for example, be used to change the dielectric constant or act as an insulator. Thus, the present invention recognizes that although a substrate or object can be directly written on, its properties may not always be appropriate for a particular design and when such is the case, a portion of the surface of the object can be modified through direct writing of a dielectric isolation band.

Dielectric patches may be written as the present invention recognizes that there may be a need for conducting lines to cross or intersect, yet without making electrical connection between the particular conducting lines. To avoid this electrical connection, dielectric patches are directly written in the area where the conducting lines are to cross or intersect. Thus these conducting lines are allowed to cross or intersect in two dimensions, but do not come in electrical conduct due to the placement of the dielectric patches which prevent an interconnection in three dimensions.

In step 34, the present invention provides for direct writing of discrete electronic components. Examples of such components include resistors, capacitors, inductors, antennas, printed batteries, and other such components.

It should be appreciated that the steps shown in FIG. 4 need not occur in the particular order presented, but can occur in any appropriate order. It should further be understood that the manufacturing of a particular 3D electronic circuit may be an iterative process due to the use of multiple layers and thus various steps are performed at different points in time. In such instances, multiple direct writing tools are used, such as one tool for each different substance being written.

Figure 5:
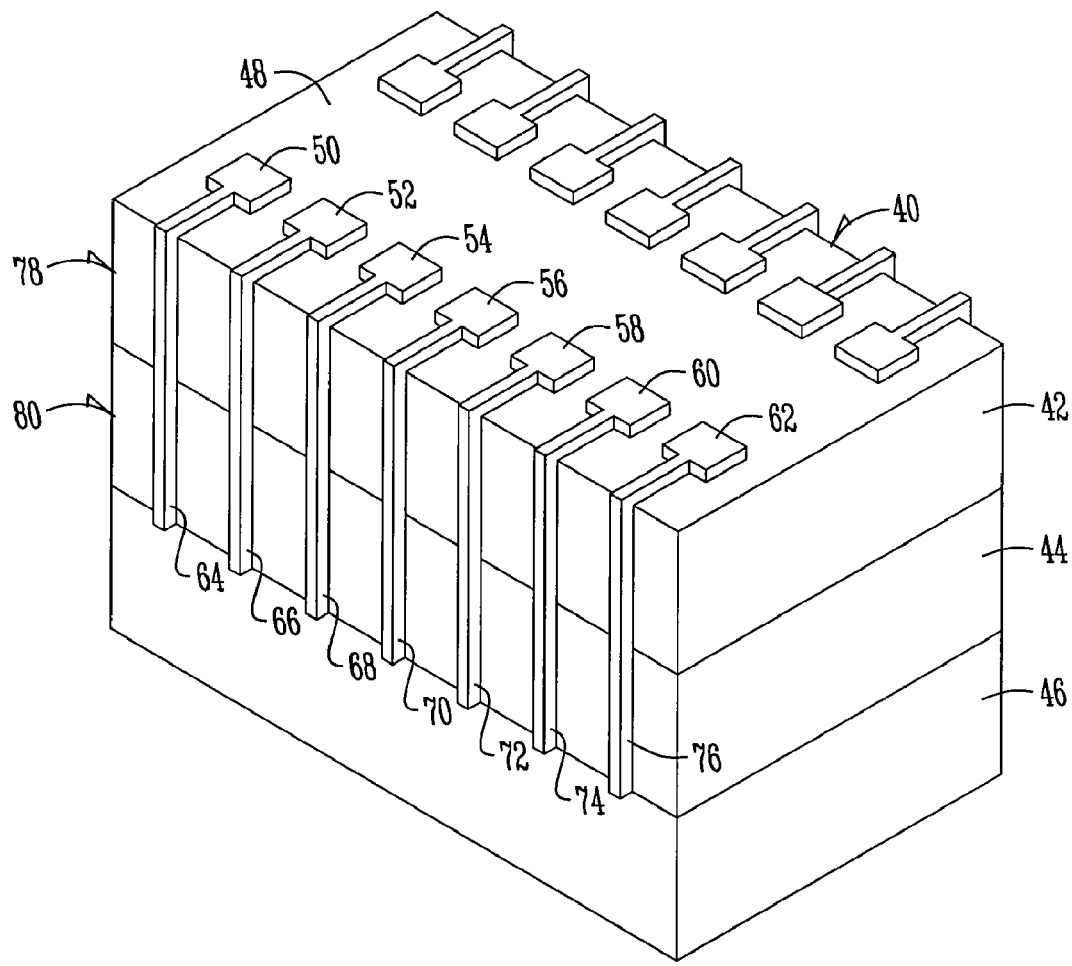
FIG. 5 illustrates one embodiment of a vertical stack of electronic components where bus lines are run along an edge of the vertical stack according to one embodiment of the present invention.

FIG. 5 illustrates one embodiment of a vertical stack of electronic components where bus lines are run along an edge of the vertical stack according to one embodiment of the present invention. The vertical stack 40 includes bare dies 42, 44, and 46. A top surface 48 of bare die 42 is shown. Connectors 50, 52, 54, 56, 58, 60, and 62 are shown for interconnecting conductor lines. The interconnecting conducting lines 64, 66, 68, 70, 72, and 74 extend along edge 78 of bare die 42 and edge 80 of bare die 44. The interconnecting conducting lines form a bus like connection between connectors in all three of the stacked bare dies 42, 44, 46. Such a bus like connection is particularly useful for the stacking of integrated circuits such as memory circuits. Of course, conducting lines can be written along any edge of one or more components within a stack, the components within a stack need not be of the same type—instead, the stack may be a hybrid stack.

Figure 6:
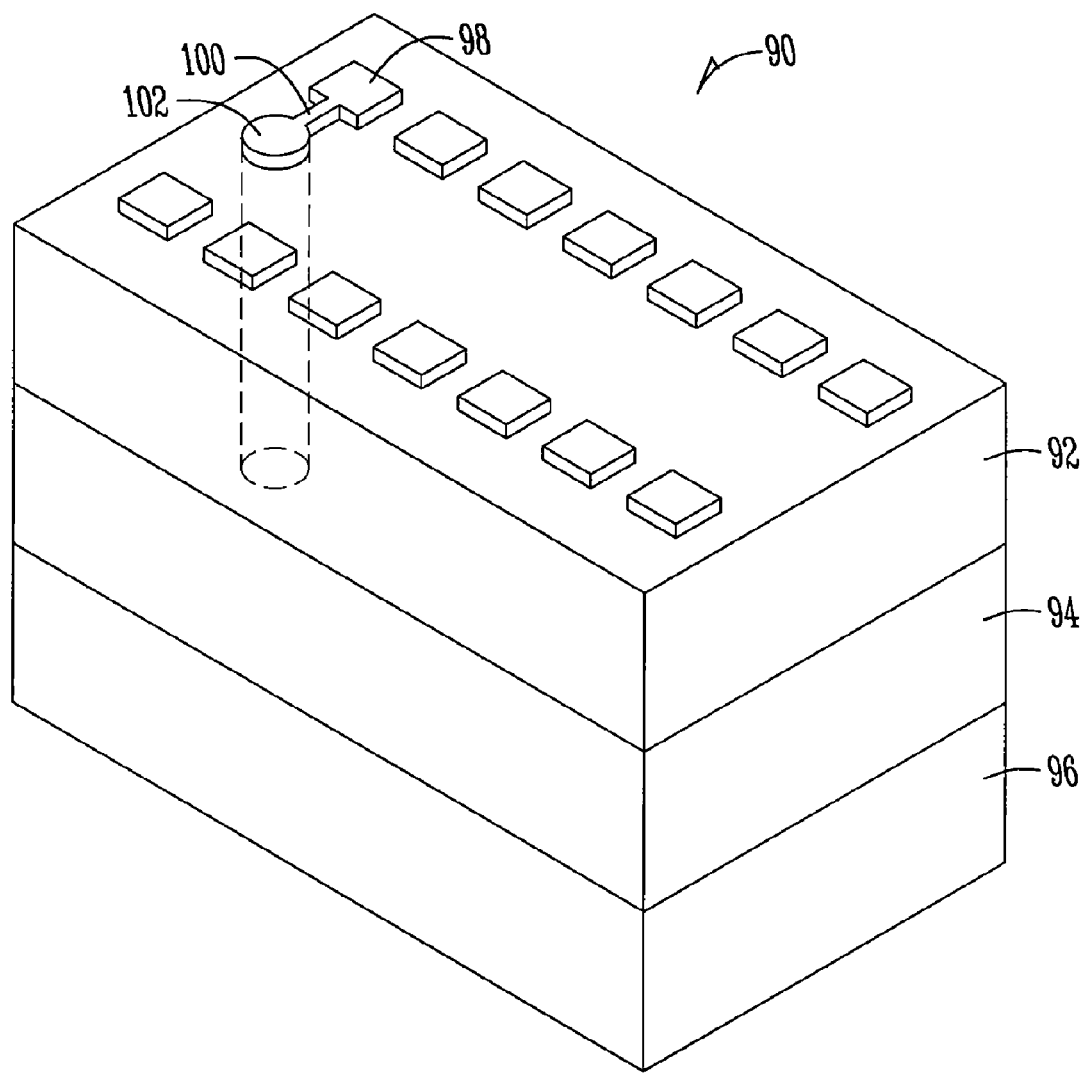
FIG. 6 illustrates another embodiment of a vertical stack of electronic components using a via to interconnect connections in different components within the stack.

FIG. 6 illustrates another embodiment of a vertical stack of electronic components using a via to interconnect connections in different components within the stack. The vertical stack 90 includes a first electronic component 92, a second electronic component 94, and a third electronic component 96. A connector 98 is electrically connected using an interconnecting conductor line 100 to a via 102 which is through the electronic component. A via may be used where there is not sufficient space for directly writing down the edges of electronic components, such as when too many connections are present to directly write down the edges of the electronic components. The topologically necessary interconnections between the chips within the vertical stack, which can not be routed to the edges of the chips, are realized by injection of the conducting paste in the vias, which are laser drilled or reactively etched through the surface of the chips.

Figure 7:
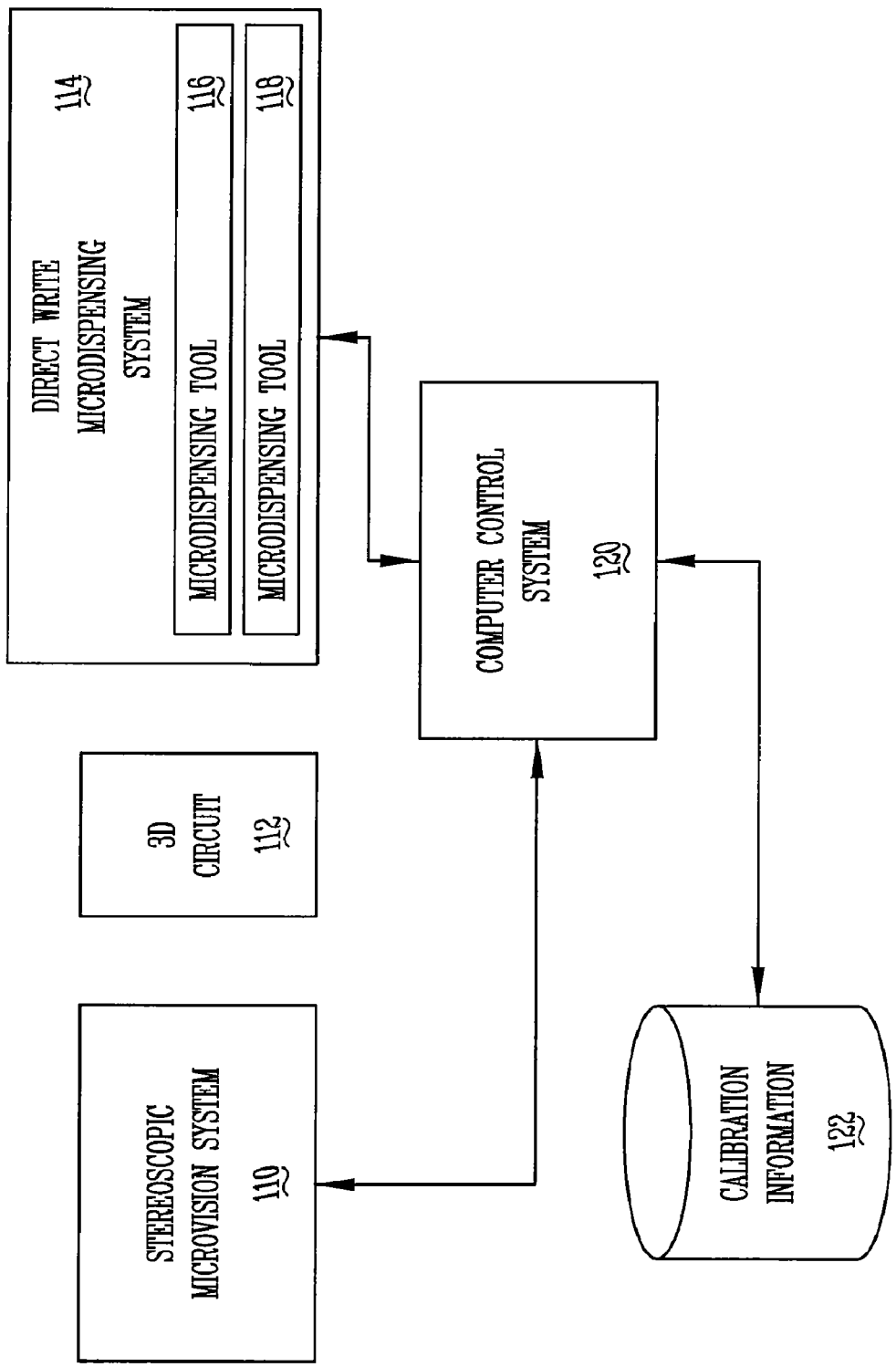
FIG. 7 is a block diagram illustrating one embodiment of a computer controlled system for manufacturing of 3D electronic circuits including multiple articulated writing tools for microdispensing of different substances, vision system and provisions for referencing and calibration of the microdispensing tools.

FIG. 7 is a block diagram illustrating one embodiment of a computer controlled system for manufacturing of 3D electronic circuits including multiple articulated writing tools for microdispensing of different substances, a vision system, and provisions for referencing and calibration of the microdispensing tools. As shown in FIG. 7, a 3D circuit 112 under construction is shown. A vision system 110 is in close proximity to the 3D circuit. Preferably the vision system is a stereoscopic microvision system, however, other types of vision systems may be used which assist in determining accurate location. A direct write system 114 is used for direct writing on the 3D circuit 112. Preferably, the direct write system 114 is a direct write microdispensing system, although other types of direct write technologies may be used, including inkjet technology. The direct write microdispensing system 114 preferably includes multiple direct write tools. Where the system is a microdispensing system, the system may include multiple microdispensing tools 116, 118. The greater the number of tools available, the greater the flexibility in direct writing different substances. Both the vision system 110 and the direct write system 114 are in operative communication with computerized control system 120. The computer control system 120 provides for high precision of the direct writing of various substances by multiple articulated direct writing tools through computer controlled placement and application rate or dispensing rate. Precise aiming of the microdispensing tools 116, 118 is accomplished with the aid of computerized vision system 110. Preferably the vision system 110 is a stereoscopic microvision system 110 to allow for accurately obtaining of information from a three-dimensional perspective; however, other types of vision systems may be used.

The computer control system 120 also has access to calibration information 120. The accuracy of the written 3D electronic circuit is assured by calibration of computer control software associated with computer control 120 by homing tips of every microdispensing tool 116, 118 against well defined hardware-embedded reference under observation of the vision system 110. Thus, in this manner, proper location can be maintained for precise aiming.

Thus, a method for constructing a 3D electronic circuit has been provided. The present invention contemplates numerous variations in the type of components used in the 3D electronic circuit, the type of direct writing being performed, the materials used in the direct writing process, and other variations. The present invention is not to be limited to what is specifically described herein.

What is claimed is:

1. A method for manufacturing an electronic circuit comprised of electronic components in three-dimensional space, the method comprising:
   interconnecting an electrical connection of a first electronic component and an electrical connection of a second electronic component by directly writing a conducting line in three dimensions from the electrical connection of the first electronic component to the electrical connection of the second electrical component;
   wherein the directly writing the conducting line in three dimensions comprises directly writing the conducting line in free space such that at least a portion of the conducting line is not directly attached to any surface.

2. The method of claim 1 wherein the step of directly writing conducting lines in three dimensions includes directly writing conducting lines along a substrate surface and at least one additional surface, each of the at least one additional surface non-planar with the substrate surface.

3. The method of claim 1 wherein the step of directly writing conducting lines being performed by directly writing microdispensed conducting lines.

4. The method of claim 1 wherein the step of directly writing conducting lines being performed by directly writing ink jet conducting lines.

5. The method of claim 1 wherein the conducting lines comprising a curable conductive polymer resin.

6. The method of claim 5 wherein the curable conductive polymer resin being thermo-curable or UV-curable.

7. The method of claim 1 wherein the conducting lines comprising a reflowable solder paste.

8. The method of claim 1 wherein the conducting lines comprising a particle loaded carrier.

9. The method of claim 1 wherein at least a portion of the conducting lines being directly written on a substrate.

10. The method of claim 9 wherein the substrate being of a conformal shape.

11. The method of claim 1 wherein at least a portion of the conducting lines being directly written on the electronic components.

12. The method of claim 1 further comprising directly writing at least one dielectric isolation band and wherein at least a portion of the conducting lines being directly written on the at least one dielectric band.

13. The method of claim 1 wherein portions of conducting lines intersecting in two dimensions being separated by a dielectric isolating patch to prevent electrical contact.

14. The method of claim 1 wherein the electronic components comprise bare die chips.

15. The method of claim 1 wherein the electronic components comprise pre-packaged integrated circuits.

16. The method of claim 1 wherein the electronic components include at least one vertically stacked array of electronic components wherein members of the vertically stacked array of electronic components having connections formed by directly written conducting lines.

17. The method of claim 16 wherein the conducting lines being written on edges of the members of the vertically stacked array of electronic components.

18. The method of claim 16 wherein the conducting lines include a parallel bus of conducting lines written on edges of members of the vertically stacked array of electronic components to provide a bus connection.

19. The method of claim 16 wherein the members of the vertically stacked array of electronic components are of separate types of electronic components and wherein dielectric isolating patches being used to avoid electrical connect at two dimensional intersections of the conducting lines.

20. The method of claim 16 further comprising forming vias through the surface of one or more of the members of the vertically stacked array of electronic components for making interconnections between members of the vertically stacked array of electronic components.

21. The method of claim 20 further comprising injecting conducting paste in the vias for making the interconnections between members of the vertically stacked array of electronic components.

22. The method of claim 21 wherein the vias being formed by laser drilling.

23. The method of claim 21 wherein the vias being formed by reactive etching.

24. The method of claim 1 wherein the electronic components include one or more electronic components from the set consisting of a resistor, a capacitor, an inductor, an antenna, a printed battery.

25. The method of claim 1 wherein the electronic components include at least one discrete element formed by direct writing.

26. The method of claim 1 wherein the step of directly writing conducting lines being performed by a direct write system controlled in part based on input from a vision system to assist in proper placement of the conducting lines in the electronic circuit.

27. The method of claim 26 wherein the vision system is a stereoscopic microvision system.

28. The method of claim 26 wherein the direct write system is a direct write microdispensing system.

29. The method of claim 1 wherein the step of directly writing conducting lines in three dimensions includes directly writing conducting lines along a substrate surface and an additional surface, wherein the substrate surface and the at least one additional surface being separated by free space, and wherein at least a portion of one of the conducting lines extends in the free space between the substrate surface and the at least one additional surface.

30. A method for manufacturing an electronic circuit comprised of electronic components in three-dimensional space, the method comprising:
    interconnecting an electrical connection of a first electronic component on a first substrate and an electrical connection of a second electronic component on a second substrate by directly writing a conducting line in three dimensions from the electrical connection of the first electronic component to the electrical connection of the second electrical component;
    wherein the first substrate and the second substrate do not provide coplanar mounting surfaces and the conducting line is supported by the first connection and the second connection and at least a portion of the conducting line is not directly attached to any surface.

* * * * *

UNITED STATES PATENT AND TRADEMARK OFFICE
CERTIFICATE OF CORRECTION

| | | |
|---|---|---|
| PATENT NO. | : 7,972,650 B1 | Page 1 of 1 |
| APPLICATION NO. | : 11/457400 | |
| DATED | : July 5, 2011 | |
| INVENTOR(S) | : Church et al. | |

It is certified that error appears in the above-identified patent and that said Letters Patent is hereby corrected as shown below:

In the Specification

Col. 1, Line 4, Before Priority Statement insert the following paragraph:
--GRANT REFERENCE
This invention was made with Government support under Contract No. FA9453-09-C-0030, awarded by the United States Air Force. The Government has certain rights in the invention.--

Signed and Sealed this
Twenty-seventh Day of January, 2015

Michelle K. Lee
*Deputy Director of the United States Patent and Trademark Office*